United States Patent
Dong et al.

(10) Patent No.: US 7,434,719 B2
(45) Date of Patent: Oct. 14, 2008

(54) ADDITION OF $D_2$ TO $H_2$ TO DETECT AND CALIBRATE ATOMIC HYDROGEN FORMED BY DISSOCIATIVE ELECTRON ATTACHMENT

(75) Inventors: Chun Christine Dong, Macungie, PA (US); Eugene Joseph Karwacki, Jr., Orefield, PA (US); Richard E. Patrick, Tamaqua, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 524 days.

(21) Appl. No.: 11/298,262

(22) Filed: Dec. 9, 2005

(65) Prior Publication Data

US 2007/0131736 A1 Jun. 14, 2007

(51) Int. Cl.
*B23K 35/38* (2006.01)
*B23H 3/00* (2006.01)

(52) U.S. Cl. .......................... 228/220; 216/13; 216/63; 216/78; 205/640; 219/129; 219/85.22; 257/E21.252

(58) Field of Classification Search ......... 228/102–105, 228/203, 205, 207, 214, 218–221, 33, 42; 219/129, 85.22, 85.1; 216/13, 63, 78; 205/640; 257/E21.252
See application file for complete search history.

(56) References Cited

U.S. PATENT DOCUMENTS

| | | | |
|---|---|---|---|
| 3,343,027 A | 9/1967 | Frohlich | |
| 3,628,079 A | 12/1971 | Dobbs et al. | |
| 3,742,213 A | 6/1973 | Cohen et al. | .......... 250/41.9 TF |
| 4,379,218 A | 4/1983 | Grebe et al. | |
| 5,105,761 A | 4/1992 | Charlet et al. | ............... 118/723 |
| 5,239,161 A | 8/1993 | Lang | |
| 5,262,001 A | 11/1993 | Takehara | |

(Continued)

FOREIGN PATENT DOCUMENTS

DE 196 54 250 A1 3/1998

(Continued)

OTHER PUBLICATIONS

Nicolas Potier, et al, "Fluxless Soldering Under Activated Atmosphere..," Surf. Mount Intl. Conf., 1995, San Jose, Ca.

(Continued)

*Primary Examiner*—Jennifer McNeil
*Assistant Examiner*—Carlos Gamino
(74) *Attorney, Agent, or Firm*—Geoffrey L. Chase (57) ABSTRACT

A method of detecting and calibrating dry fluxing metal surfaces of one or more components to be soldered by electron attachment using a gas mixture of reducing gas comprising hydrogen and deuterium, comprising the steps of: a) providing one or more components to be soldered which are connected to a first electrode as a target assembly; b) providing a second electrode adjacent the target assembly; c) providing a gas mixture comprising a reducing gas comprising hydrogen and deuterium between the first and second electrodes; d) providing a direct current (DC) voltage to the first and second electrodes to form an emission current between the electrodes and donating electrons to the reducing gas to form negatively charged ionic reducing gas and molecules of hydrogen bonded to deuterium; e) contacting the target assembly with the negatively charged ionic reducing gas and reducing oxides on the target assembly. Related apparatus is also disclosed.

23 Claims, 6 Drawing Sheets

U.S. PATENT DOCUMENTS

| | | | |
|---|---|---|---|
| 5,345,056 A | 9/1994 | Frei et al. | |
| 5,409,543 A | 4/1995 | Panitz et al. | 134/2 |
| 5,433,820 A | 7/1995 | Sindzingre et al. | 216/13 |
| 5,545,894 A * | 8/1996 | Funsten et al. | 250/281 |
| 5,693,241 A | 12/1997 | Banks et al. | |
| 5,722,581 A | 3/1998 | Sindzingre et al. | 228/206 |
| 5,744,733 A * | 4/1998 | Bridenbaugh et al. | 73/865.6 |
| 5,807,614 A | 9/1998 | Sindzingre et al. | 427/540 |
| 5,807,615 A | 9/1998 | Sindzingre et al. | 427/562 |
| 5,837,958 A | 11/1998 | Fornsel | |
| 5,858,312 A | 1/1999 | Sindzingre et al. | 422/186.04 |
| 5,928,527 A | 7/1999 | Li et al. | 216/67 |
| 5,941,448 A | 8/1999 | Sindzingre et al. | 228/206 |
| 5,985,378 A | 11/1999 | Paquet | 427/562 |
| 6,004,631 A | 12/1999 | Mori | 427/534 |
| 6,006,763 A | 12/1999 | Mori et al. | |
| 6,007,637 A | 12/1999 | Sindzingre et al. | 134/2 |
| 6,021,940 A | 2/2000 | Sindzingre et al. | 228/203 |
| 6,037,241 A | 3/2000 | Powell et al. | 438/479 |
| 6,077,388 A | 6/2000 | Freeman | |
| 6,089,445 A | 7/2000 | Sindzingre et al. | 228/218 |
| 6,100,496 A | 8/2000 | Takuya et al. | |
| 6,146,503 A | 11/2000 | Sindzingre et al. | |
| 6,158,648 A | 12/2000 | Mori et al. | |
| 6,174,500 B1 | 1/2001 | Uno et al. | 422/186.14 |
| 6,193,135 B1 | 2/2001 | Fang et al. | 228/105 |
| 6,194,036 B1 | 2/2001 | Babayan et al. | 427/563 |
| 6,196,446 B1 | 3/2001 | Fang et al. | 228/219 |
| 6,203,637 B1 | 3/2001 | Dommann et al. | 156/73.1 |
| 6,277,733 B1 * | 8/2001 | Smith | 438/636 |
| 6,605,175 B1 * | 8/2003 | Ramm et al. | 156/272.6 |
| 6,776,330 B2 * | 8/2004 | Dong et al. | 228/220 |
| 6,908,846 B2 * | 6/2005 | McMillin et al. | 438/622 |
| 7,387,738 B2 * | 6/2008 | Dong et al. | 216/13 |
| 2004/0038319 A1 * | 2/2004 | Aebersold et al. | 435/7.5 |
| 2004/0211675 A1 | 10/2004 | Dong et al. | |
| 2006/0191867 A1 | 8/2006 | Hayashi | |

FOREIGN PATENT DOCUMENTS

| | | |
|---|---|---|
| EP | 0 207 731 A | 1/1987 |
| EP | 0 997 926 | 5/2000 |
| EP | 1 291 111 A1 | 3/2003 |
| FR | 2 586 334 A | 2/1987 |
| JP | 10 314934 A | 2/1998 |
| JP | 2002 001253 A | 1/2002 |
| WO | WO 00/65887 | 11/2000 |
| WO | WO 01/41963 | 6/2001 |

OTHER PUBLICATIONS

N. Koopman, et al, "Fluxless Flip Chip Solder Joining," Nepcon West '95 Proceedings, pp. 919-931.

P. John Shiloh, et al, "Flux-Free Soldering," Nepcon West '94 Proceedings, pp. 251-273.

D. Swanson, "Fluxless Soldering Under Ambient Pressure Plasma Cleaning," Elec. Packaging and Production, Oct. 1995, p. 32, vol. 35, No. 11.

Mass Spectrometry Detection of Neutral Dissociative Fragments, NTIS, Air Force Inst. of Tech., Wright-Patterson AFB, Oh. Schoo of Engrg., Dec. 1982.

* cited by examiner

ADDITION OF D$_2$ TO H$_2$ TO DETECT AND CALIBRATE ATOMIC HYDROGEN FORMED BY DISSOCIATIVE ELECTRON ATTACHMENT

BACKGROUND OF THE INVENTION

Reflow soldering is the most widely used technique in the assembly of surface-mount electronic components. In the reflow soldering process, components are mounted on the corresponding trace area of a circuit board with a solder paste previously printed on the circuit board. Such formed soldering parts are then loaded into a reflow furnace, passing through heating and cooling zones and solder joints between component leads and solder lands on the circuit board are formed by melting, wetting, and solidifying the solder paste. To ensure a good wetting of the molten solder on the joining surfaces, organic fluxes are normally contained in the solder pastes to remove initial surface oxides on both solder and base metal and to keep the surfaces in a clean state before solidification. The fluxes are mostly evaporated into vapor phase during soldering, however, the flux volatiles may cause problems, such as forming voids in the solder joints and contaminating the reflow furnace. After soldering, there are always some flux residues left on the circuit board that may cause corrosion and electric shorts.

Wave soldering, on the other hand, is a traditionally used soldering method for assembling insertion-mount components. It also can be used for surface-mount components by temporarily bonding the components on the circuit board by an adhesive before soldering. For both cases, the circuit boards with components inserted or temporarily bonded have to be cleaned by using a liquid flux to remove oxides on the component leads and solder lands, and then pass through a high temperature molten solder bath. The molten solder automatically wets the metal surfaces to be soldered and solder joints are thus formed. The molten solder in the bath has a high tendency to be oxidized, forming solder dross. Therefore the surface of the solder bath has to be frequently cleaned by mechanically removing the dross, which increases the operation cost and the consumption of the solder. After soldering, flux residues remain on the circuit boards, which brings the same problems as described for reflow soldering.

To remove the flux residues, a post-cleaning process has to be used. Chlorofluorocarbons (CFCs) were normally used as the cleaning agents, but they are believed to be damaging the earth's protective ozone layer and their use was banned. Although no-clean fluxes have been developed by using a small amount of activators to reduce residues, there is a trade off between the gain and loss in the amount of flux residues and the activity of the fluxes.

A good solution to all the problems described above, including flux volatiles, flux residues, and dross formation, is using a reducing gas as a soldering environment to replace organic fluxes for removing metal oxides. Such soldering technique is called "fluxless soldering". Among various fluxless soldering methods, the use of hydrogen as a reactive gas to reduce oxides on base metals and solders is especially attractive because it is a very clean process (the only by-product is water which can be easily ventilated out of the furnace), and it can be compatible with an open and continued soldering production line (H$_2$ is non-toxic and has a flammable range of 4 to 75%). Therefore, hydrogen fluxless soldering has been a technical goal for a long time.

However, the major limitation of hydrogen fluxless soldering is the inefficient and slow reduction rate of metal oxides in hydrogen at the normal soldering temperature range, especially for solder oxides, which have higher metal-oxygen bond strengths than that of the oxides on the base metals to be soldered. This inefficiency of hydrogen is attributed to the lack of reactivity of the hydrogen molecule at low temperatures. Highly reactive radicals, such as mono-atomic hydrogen, form at temperatures much higher than the normal soldering temperature range. For example, the effective temperature range for pure H$_2$ to reduce tin oxides on a tin-based solder is above 350° C. Such high temperatures may either damage integrated circuit (IC) chips or cause reliability problems. Therefore, a catalytic method to assist generating highly reactive H$_2$ radicals in the normal soldering temperature range has been sought by the industry.

Fluxless (dry) soldering has been performed in the prior art using several techniques:

Chemically active halogen-containing gases, such as $CF_4Cl_2$, $CF_4$ and $SF_6$ can be used to remove surface oxides for soldering. However, such gases leave halide residues, which reduce solder bond strength and promote corrosion. Such compounds also present safety and environmental disposal problems, and can chemically attack soldering equipment.

Metal oxides can be ablated, or heated to their vaporization temperatures using lasers. Such processes are typically performed under inert or reducing atmospheres to prevent re-oxidation by the released contaminants. However, the melting or boiling points of the oxide and base metal can be similar, and it is not desirable to melt or vaporize the base metal. Therefore, such laser processes are difficult to implement. Lasers are also typically expensive and inefficient to operate, and must have a direct line of sight to the oxide layer. These factors limit the usefulness of laser techniques for most soldering applications.

Surface oxides can be chemically reduced (e.g., to H$_2$O) through exposure to reactive gases (e.g., H$_2$) at elevated temperatures. A mixture containing 5% or greater reducing gas in an inert carrier (e.g., N$_2$) is typically used. The reaction products (e.g., H$_2$O) are then released from the surface by desorption at the elevated temperature, and carried away in the gas flow field. Typical process temperatures must exceed 350° C. However, this process can be slow and ineffective, even at elevated temperatures.

The speed and effectiveness of the reduction process can be increased using more active reducing species. Such active species can be produced using conventional plasma techniques.

Gas plasmas at audio, radio, or microwave frequencies can be used to produce reactive radicals for surface de-oxidation. In such processes, high intensity electromagnetic radiation is used to ionize and dissociate H$_2$, O$_2$, SF$_6$, or other species, including fluorine-containing compounds, into highly reactive radicals. Surface treatment can be performed at temperatures below 300° C. However, in order to obtain optimum conditions for plasma formation, such processes are typically performed under vacuum conditions. Vacuum operations require expensive equipment and must be performed as a slow, batch process, rather than a faster, continuous process. Also, plasmas are typically dispersed diffusely within the process chamber, and are difficult to direct at a specific substrate area. Therefore, the reactive species cannot be efficiently utilized in the process. Plasmas can also cause damage to process chambers through a sputtering process, and can produce an accumulation of space charge on dielectric surfaces, leading to possible micro-circuit damage. Microwaves themselves can also cause micro-circuit damage, and substrate temperature may be difficult to control during treatment. Plasmas can also release potentially dangerous ultra-violet light. Such processes also require expensive electrical equipment and consume considerable power, thereby reducing their overall cost effectiveness.

U.S. Pat. No. 5,409,543 discloses a process for producing a reactive hydrogen species using thermionic (hot filament) emission of electrons. The energized hydrogen chemically reduces the substrate surface. The thermionic electrons are emitted from refractory metal filaments held at temperatures from 500° C. to 2200° C. Electrically biased grids are used to deflect or capture excess free electrons. The reactive species are produced from mixtures containing 2% to 100% hydrogen in an inert carrier gas.

U.S. Pat. No. 6,203,637 also disclosed a process for activating hydrogen using the discharge from a thermionic cathode. In this case the emission process is performed in a separate (remote) chamber containing a heated filament. Ions and activated neutrals flow into the treatment chamber to chemically reduce the oxidized metal surface. However, such hot cathode processes require vacuum conditions for optimum effectiveness and filament life. Vacuum operations require expensive equipment, which must be incorporated into soldering conveyor belt systems, thereby reducing their overall cost effectiveness.

Potier, et al., "Fluxless Soldering Under Activated Atmosphere at Ambient Pressure", Surface Mount International Conference, 1995, San Jose, Calif., and U.S. Pat. Nos. 6,146,503, 6,089,445, 6,021,940, 6,007,637, 5,941,448, 5,858,312 and 5,722,581 describe a process for producing activated $H_2$ (or other reducing gases, such as $CH_4$ or $NH_3$) using electrical discharge. The reducing gas is present at "percent levels" in an inert carrier gas ($N_2$). The discharge is produced using an alternating voltage source of "several kilovolts". Electrons emitted from electrodes in a remote chamber produce charged and neutral hydrogen radicals, which are then flowed to the substrate. The resulting process reduces oxides on the base metal to be soldered at temperatures near 150° C. However, such remote discharge chambers require significant equipment costs, and are not easily retrofitted to existing soldering conveyor belt systems. In addition, the process is not designed for removing solder oxides.

U.S. Pat. No. 5,433,820 describes a surface treatment process using electrical discharge or plasma at atmospheric pressure from a high voltage (1 kV to 50 kV) electrode. The electrode is placed in the proximity of the substrate rather than in a remote chamber. The free electrons emitted from the electrodes produce reactive hydrogen radicals, a plasma containing atomic hydrogen, which then pass through openings in a dielectric shield placed over the oxidized substrate. The dielectric shield concentrates the active hydrogen onto those specific surface locations requiring de-oxidation. However, such dielectric shields can accumulate surface charge that may alter the electric field and inhibit precise process control. The described process is only used to flux base metal surfaces.

A government report (U.S. Department of Commerce, National technical Information Service, 1982) entitled "Mass Spectrometry Detection of Neutral Dissociative Fragments" can be summarized as follows. The feasibility of detecting neutral fragments from molecule dissociation processes was investigated using mass spectrometer. The mass spectrometer was equipped with dual ionizers. One inizer was used to form neutral and ionic dissociation fragments (by gas discharge). The neutral fragments proceeded to the second ionizer for ionization (by gas discharge) and subsequent detection. The difference in the measured signal when the first ionizer was on or off would reveal information on the formation of neutrals as a function of electron energy. This study was used for detection of neutral N and H fragments from $N_2$ and $H_2$. Our invention is quite deferent to this prior art. In our invention the mass spectrometer doesn't need to be modified, which makes the analytical work a lot of simple.

U.S. Pat. No. 6,776,330 is directed to dissociative electron attachment for hydrogen fluxing of solder, but does not envision the use of deuterium, as in the present invention.

Additional prior art of interest include: U.S. Pat. Nos. 3,742,213; 5,105,761; 5,807,614; 5,807,615; 5,928,527; 5,985,378; 6,004,631; 6,037,241; 6,174,500; 6,193,135; 6,194,036; 6,196,446; Koopman, et. al., Fluxless Flip Chip Solder Joining, NEPCON WEST '95 PROCEEDINGS, pp 919-931; and Shiloh, et. al., Flux-free Soldering, NEPCON WEST '94 PROCEEDINGS, pp 251-273.

The shortcomings of the prior art in providing an economical and efficient fluxless soldering process to remove base metal and solder oxides for superior soldering without oxide or flux flaws in the solder joint are overcome by the present invention, which provides fluxless soldering at low temperatures, near ambient or atmospheric conditions and with low DC power requirements or similar low energy electron propagation to use negatively charged ionic hydrogen to actively react with oxides before or during the soldering operation, as set forth in greater detail below.

BRIEF SUMMARY OF THE INVENTION

The present invention is a method of dry fluxing metal surfaces of one or more components to be soldered by electron attachment using a gas mixture of reducing gas comprising hydrogen and deuterium, comprising the steps of: a) providing one or more components to be soldered which are connected to a first electrode as a target assembly; b) providing a second electrode adjacent the target assembly; c) providing a gas mixture comprising a reducing gas comprising hydrogen and deuterium between the first and second electrodes; d) providing a direct current (DC) voltage to the first and second electrodes to form an emission current between the electrodes and donating electrons to the reducing gas to form negatively charged ionic reducing gas and molecules of hydrogen bonded to deuterium; e) contacting the target assembly with the negatively charged ionic reducing gas and reducing oxides on the target assembly.

This method can be used to detect that negatively charged ionic reducing gas is formed to confirm the formation of those species, which are otherwise difficult to detect and confirm.

The method includes the measurement of the molecules of hydrogen bonded to deuterium as an indication of the extent of dissociative electron attachment to form negatively charged hydrogen ions to allow the process parameters to be adjusted to maximize the molecules of hydrogen bonded to deuterium and thus the negatively charged hydrogen ions.

Related apparatus is also disclosed comprising a cathode with emission tips to enhance the flow of electrons between the cathode and the anode.

DETAILED DESCRIPTION OF THE INVENTION

The present invention concerns $H_2$ fluxless soldering, particularly wafer bumping reflow soldering. The present invention can be made by modifying the traditional reflow or wave soldering machine. The present invention is also applicable to metal plating, such as the solder plating of portions of printed circuit boards or metal surfaces to make them more amenable to subsequent soldering. The removal of oxides by hydrogen fluxless processing (dry fluxing) of the present invention is equally applicable to such metal plating techniques.

The removal of initial solder oxides and prevention of further oxide formation during reflow can be accomplished in numerous ways. Currently, the most commonly used approach is to coat the electroplated solder bumps on the wafer with a flux before reflow, or mix the flux with the solder paste that has been printed onto the wafer to form the bumps. The flux-coated wafer or the wafer with flux-containing solder bumps is then reflowed in a nitrogen atmosphere that further minimizes the formation of solder oxides. During reflow the flux effectively removes the oxide layer present on the solder surface. However, this flux-containing reflow can cause process problems and inconveniences. For example, when organic fluxes decompose during heating, volatile materials are generated. These volatiles can be trapped in the molten solder and form voids, which not only degrade mechanical and electrical properties, but also destroy the co-planarity of the solder-bumped wafer and affect the following chip bonding process. Flux volatiles will also condense and accumulate on the furnace wall, which increases the maintenance cost and equipment downtime. Organic fluxes after decomposition always leave residua, which can cause corrosion and degrade the performance of the assembly. For example, flux residua can deflect or attenuate laser signals in optoelectronic assemblies, and thus impact the performance of emitter or receiver components.

To remove flux residua, post-cleaning is required. Chlorofluorocarbons (CFCs) were commonly used as the cleaning agents, however, their use has been banned to reduce further damage to the earth's protective ozone layer. Although no-clean fluxes, which employ a small amount of activators to reduce residua are available, there is always a tradeoff between gain and loss in the amount of flux residua and activity of the fluxes.

As a result there is growing interest in the use of fluxless solder reflow for wafer bumping. Despite continuous advances in fluxless technologies, none are widely applied within the integrated circuit (IC) fabrication industry. A fluxless solution which is efficient, simple, reliable, cost effective, and environmentally safe remains a high priority goal for advanced IC packaging.

Among various fluxless approaches, the use of hydrogen as a reactive gas to reduce oxides on base metals and solders is especially attractive because it is a very clean and non-toxic process. The only by-product is water which can easily ventilated out of the furnace. The major limitation of hydrogen fluxless solder reflow is the lack of reactivity of molecular hydrogen at the normal solder reflow temperature range, which is approximately 30° C. above the solder's melting point. For this approach to be effective, pure hydrogen needs to be used. However, pure hydrogen is a highly flammable gas and it must be activated by heating it to temperatures higher than 370° C. to provide sufficient activation energy for oxide reduction. In addition to requiring an increase in power consumption and changeover time, the high temperature requirement precludes the use of low-melting point solders due to coarsening of intermetallic compounds (IMCs).

These limitations to hydrogen fluxless solder reflow has led many investigators to pursue various catalytic methods to assist in generating highly reactive hydrogen radicals, among which plasma assisted fluxless reflow is the one being more extensively studied methodologies. A recent study has shown plasma reflow bumping of lead-free solders in a gas mixture of 10 vol % $H_2$ in Ar. However, the joint strength formed in such a process is relatively low due to plasma heating induced IMC coarsening. In addition, to obtain the optimum condition for plasma formation, such a process must be operated under vacuum. Vacuum not only increases capital and operating costs, but also confines the process to a slow and discontinuous batch process; this reduces the throughput and increases changeover time. Atmospheric plasma has also been investigated. Its limitations appear to be the potentially high energy consumption and relatively low efficiency due to short lifetimes for active species generated within an atmospheric process.

Figure 1:
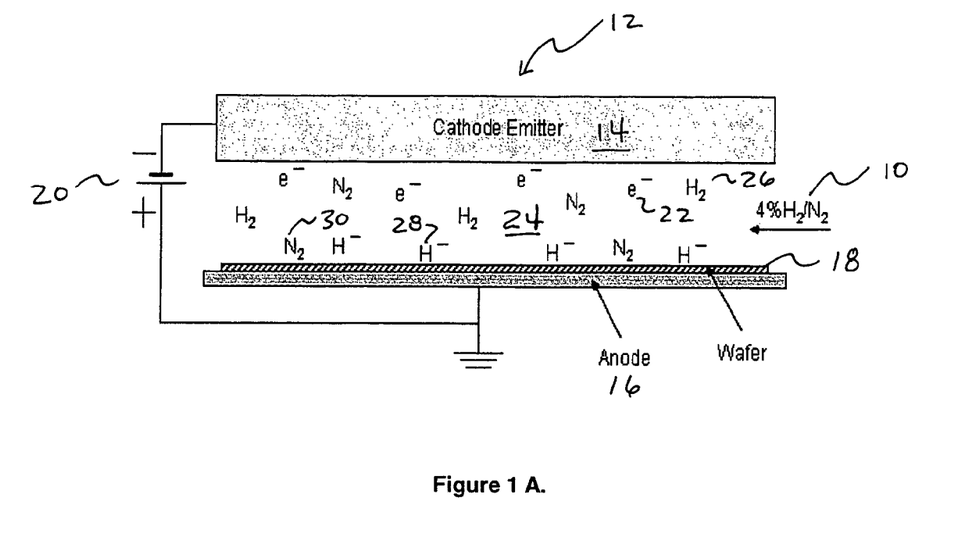
FIG. 1A is a schematic illustration of the generation of negative hydrogen ions by dissociative electron attachment of the present invention.
FIG. 1B is a schematic illustration of an experimental electron attachment device of the present invention.

The principal of the method can be shown in FIGS. 1A and 1B. During soldering or fluxing, a gas mixture of nitrogen and a reducing gas 10, such as hydrogen or carbon monoxide, is introduced into a heating chamber, oven or a furnace 12 with a cathode 14 and anode 16 and the parts 18 to be soldered or fluxed are connected to or mounted on the anode 16 to form a target assembly 16/18. When a DC voltage 20 is applied between the cathode 14 and the anode 16, low-energy electrons 22 are generated at the cathode 14 and drift to the anode 16 in the electric field 24. During this electron drift, a part of the molecular reducing gas, i.e., $H_2$ 26, can form negative ions 28 by electron attachment and then drift to the anode 16 also. At the anode 16, the negatively charged ionic hydrogen 28 can attach on the solder and metal surfaces to be soldered and thus reduce the respective oxides, without the use of traditional fluxes. During this process, the inert gas, i.e., $N_2$ 30, is not affected, because the electron affinity of nitrogen is zero.

For the present invention, the $H_2$ concentration in the gas mixture may be comprised between approximately 0.1 to 100% by volume, and more preferably between approximately 0.5 to 50% by volume, and most preferably less than or equal to 4 volume %, to avoid flammability of the reducing gas mixture. The temperature may be ambient or above, or preferably range between approximately 100° C. to 400° C., and more favorably between approximately 220° C. to 325° C. The DC voltage may comprise between approximately −1 to −50 kV, and the preferred range is between approximately −2 to −30 kV. The distance between the cathode and the top surface of the parts to be treated may be approximately 0.5 to 10 cm, and the preferred range is approximately 1 to 5 cm. The cathode or device from which the electrons are generated (photoemissive or radioactive source) should be close to the anode or target assembly and does not require a separate chamber or zone. Besides $H_2$, other reducing gases may also be used in the gas mixture, such as CO. The inert gas used in the gas mixture other than $N_2$ can be Ar, He, and others. The pressure is preferably ambient atmospheric pressure, meaning the existing pressure of the area of the process. No special pressure, such as vacuum, is required. Typically, pressures of 10 to 20 psia would be acceptable, but a pressure of 14 to 16 psia, preferably 14.7 psia, is most appropriate.

In addition to the electron attachment technique described above, electron attachment to hydrogen molecules or diatomic hydrogen can be accomplished by photoemission from a photosensitive cathode, electron beam techniques, radioactive source techniques, and avalanche techniques where cascading initial electrons drift to successively higher potential electrodes in an electrode array causing additional electrons from each succeeding electrode. Photoemission of free low energy electrons may occur following, for example, exposure of a photosensitive source to ultraviolet or other suitable wavelength light. In those techniques where the electrons are not emitted due to a DC voltage (i.e., photoemission) the cathode and anode would still be biased to draw the generated electrons and ultimately the negatively charged ionic hydrogen molecule or diatomic hydrogen to the anode.

Although not wanting to be held to any particular theory on the mechanism of the present invention, the inventors believe that when a direct current voltage is applied to the electrodes, low energy electrons are generated at the cathode and drift toward the anode in the electric field. Low energy electrons have enough energy to leave the cathode and attach to molecular or diatomic hydrogen to dissociate the hydrogen molecule. During the electron drift, a part of the molecular reducing gas, such as hydrogen, can form negative ions by electron attachment and then drift to the anode also. At the anode, the negatively charged ionic hydrogen can attach on the solder and the base metal surfaces to be soldered and thus reduce the existing oxides of solder and base metal. The activation energy of oxide reduction using the electron attachment process of the present invention is lower than without the attachment because bombardment with attached electrons eliminates most of the energy required for the bond breaking of the oxides.

In a preferred application of the present invention, wafer bumping is used to form solder bumps over an entire silicon wafer onto which integrated circuits have been built upon. The bumping process is a critical step in packaging of devices since the bumps formed on the wafer serve as electrical, mechanical, and mounting connections for flip-chip assemblies. Therefore, bumps must exhibit superior adhesion to the die, minimum electrical resistance, and high planarity. Defects, such as voids in the bumps, non-uniform bump shapes, and residua on the wafer surface need to be prevented or minimized.

The bumps are commonly made by depositing solder onto pads, such as by electroplating or stencil printing. Solder is then reflowed at a temperature above its melting point to carry out alloying, form a metallic interconnect phase to the die, and convert the solder bumps from an as-plated mushroom shape into a semispherical shape.

Typically deposited solder contains a native surface oxide layer. When the solder is melted, the oxide remains in the solid phase that covers the molten solder, and impedes the liquid flow underneath it. Therefore, the oxide layer on the solder bump surface can significantly adversely effect the desired semispherical shape and the uniformity of the reflowed solder bumps. However, if the surface oxide layer is removed during reflow, the liquid surface tension will drive the bulk molten solder into a uniform and semispherical shape.

The shape of the solder bumps formed by wafer bumping process is very important. A large bump height is preferred for high bonding strength and fatigue resistance of the joint. The bumps formed also need to be very uniform across the entire wafer to ensure planarity. Only oxide-free bumps can meet these expectations. Therefore, efficient oxide removal during solder reflow is the key for successful wafer bumping. As bump sizes continue to decrease, solder oxidation will become more severe due to increased surface energy, and oxide removal during reflow will be more critical for ensuring the quality of the formed solder bumps.

The objective of the present invention is to develop a novel hydrogen fluxless technology, where highly reactive hydrogen species are generated under normal solder reflow conditions. More specifically, the developed technology must satisfy the following expectations.

Hydrogen species must be generated under ambient pressure to accommodate an open and continual reflow production line;

A gas mixture of $\leqq 4$ vol % $H_2$ in $N_2$ would be employed to ensure non-flammability;

Effective reflow temperature should not exceed the normal reflow temperature range; and, Capital and operating costs have to be minimal to make the process cost effective.

The limiting initiating step for hydrogen to reduce metal oxides at the normal reflow temperature range is the bond dissociation of molecular hydrogen (104.204 kcal/mole). Thus, any method that could assist generating either neutral or charged atomic hydrogen, or weaken the hydrogen bond at ambient pressure and normal reflow temperature range would be beneficial for activating the reduction process. The present invention identifies electron attachment (EA) as a potential activation process for dissociating molecular hydrogen in a dilution gas, such as nitrogen, with the hydrogen concentration below the flammability limit ($\leqq 4$ vol %). EA under atmosphere pressure has been employed to remove electronegative impurities from a gas stream for performing gas purification. However, its utility for promoting surface chemical reactions is a new field.

When low-energy electrons (<10 eV) collide with gas molecules, some are captured by gas molecules producing negative ions by dissociative attachment or direct attachment, which is generally defined as "electron attachment". At ambient pressure, the low energy electrons can be generated by cathode emission or corona discharge, or a combination of the both, where the energy of the generated electrons depends on the ratio of the electric field strength, E, to total pressure, p, or, E/p. The reason is that electrons are accelerated under an electric field within each free path, and decelerated when colliding with gas molecules. An increase in pressure increases the density of the gas molecules and promotes collisions between electrons and gas molecules. Therefore, ambient pressure is much more favorable for producing low-energy electrons and enhancing the probability of electron attachment compared with vacuum.

More specifically, the following equations describe the processes when low-energy electrons are captured by hydrogen gas molecules diluted in gaseous nitrogen.

$$\text{Dissociative attachment: } H_2 + e^- \rightarrow H_2^{-*} \rightarrow H^- + H \tag{1}$$

$$\text{Auto-detachment: } H_2 + e^- \rightarrow H_2^{-*} \rightarrow H_2^* + e^- \tag{2}$$

$$\text{Direct/radiative attachment: } H + e^- \rightarrow H^{-*} \rightarrow H^- + h\nu \tag{3}$$

$$\text{Direct/collision stabilization attachment: } H + e^- + N_2 \rightarrow H^{-*} + N_2 \rightarrow H^- + N_2 \tag{4}$$

Excited molecular hydrogen anion, $H_2^{-*}$, formed by EA is in an intermediate resonant state, which can either dissociate into $H^-$ and H by dissociative electron attachment (Equation 1) or autodetach the temporarily bound electron leaving behind a vibrational excited molecule ($H_2^*$) as shown in Equation 2. Which one of the two reactions should take place depends on the energy of the incident electron and the intranuclear separation of the hydrogen molecule. The larger the intranuclear separation, the lower the energy of the incident electron being captured by $H_2$, and the higher the probability for dissociative attachment to take place. The rate coefficient of the dissocative attachment has a peak at the electron energy around 4 eV. Equation 3 describes a secondary process to produce negatively charged atomic hydrogen ions from the impact of low-energy electrons, which occurs after the hydrogen molecules are dissociated and is named as direct or radiative attachment. Here the excess energy associated with the direct attachment is removed by radiative emission. The direct attachment process occurs with roughly the same efficiency as the primary dissociative attachment process, and its rate coefficient increases slightly with increasing the energy of incident electron. During the EA processes described above, $N_2$ with a concentration $\geqq 96$ vol % can not form negative ions by EA because the electron affinity of $N_2$ is zero. Nitrogen gas molecules can act as a third body in collision stabilization to absorb the excess energy of the excited hydrogen ions formed by direct attachment (Equation 4). In the application proposed here, the collision stabilization attachment is believed to be more important compared with radiative attachment due to ambient pressure and high nitrogen concentration applied in the system.

The experimental EA process of the present invention for solder reflow is illustrated in FIG. 1B. During reflow of a solder bumped wafer (not illustrated) mounted on anode 100, a gas mixture of $\leqq 4$ vol % $H_2$ in $N_2$ 102 is introduced into a reflow furnace 104, which typically contains heating/cooling zones located at different sections along the center axis (not illustrated), and a moving belt (not illustrated) from one end to another end of the furnace. Inside the furnace 104 an electron-emitting cathode 106 is mounted overhead and equipped with a plurality of emission tips 107, and the wafer to be reflowed is placed on a grounded metal anode 100 or moving belt. When a suitable voltage 108 is applied to the cathode 106, low energy electrons (not illustrated) are generated from the cathode 106 and move toward the anode 100 driven by the electric field. Molecular hydrogen can then collide with these electrons, forming neutral and negatively charged atomic hydrogen (Equations 1, 3, and 4). The negatively charged atomic hydrogen ions also move along the electric field toward the anode 100, which leads to a preferential adsorption of active species on the wafer surface and thus a promoted reduction of solder oxides. Equation 5 describes the solder surface dry fluxing or de-oxidation by negatively charged atomic hydrogen ions, where the dominant composition of the oxide layer on a tin-based solder surface is believed to be SnO.

$$\text{Solder surface de-oxidation: } 2H^- + SnO \rightarrow Sn + H_2O + e^- \tag{5}$$

During EA and surface de-oxidation processes, free electrons injected to or generated on the wafer surface are discharged by traveling to the solder bump positions and draining through the silicon matrix to the ground. Most of silicon wafers contain a backside oxide layer in a thickness range of less than 2.0 micron, which makes it to be electrically insulated under normal condition. The wafer can still behave as a semiconductor when the voltage gradient across the backside oxide is increased to a certain limit by charge buildup during EA.

The present invention's enhancement is an approach to detect atomic hydrogen formed by dissociative electron attachment to hydrogen molecules. The detection is conducted by employing a gas mixture of $H_2$ and $D_2$ (deuterium), and using mass spectrometry to monitor a formation of HD (molecule of hydrogen bonded to deuterium). An increase in HD when electron attachment was applied would be indicative of the dissociative attachment taking place, and thus a confirmation of the atomic hydrogen ions being created. The following equations describes the process:

$$H_2 + e^- \rightarrow H_2^* \rightarrow H^- + H \tag{6}$$

$$D_2 + e^- \rightarrow D_2^* \rightarrow D^- + D \tag{7}$$

$$H + D \rightarrow HD \tag{8}$$

where $H_2^{-*}$ and $D_2^{-*}$ represent excited molecular hydrogen and deuterium anions.

It was also found that there is a preferred gas concentration ratio of $H_2/D_2$ corresponding with the highest HD formation, which is around 2.5 rather than 1.0. A high HD formation is an indication of a more efficient dissociative electron attachment.

The present invention arose from the need to develop a controlled hydrogen fluxless solder reflow technology based on electron attachment (EA) for wafer bumping. The present invention EA process promotes dissociation of molecular hydrogen and generation of atomic hydrogen ions (Equation 6) at ambient pressure and a temperature significantly lower than that of thermal dissociation. The hydrogen ions reduce solder oxides and facilitate fluxless solder reflow at normal solder reflow temperatures by using a non-flammable hydrogen concentration ($\leqq 4$ vol %).

To control EA assisted $H_2$ fluxless solder reflow, it is desirable to demonstrate the generation of negatively charged atomic hydrogen ions by dissociative electron attachment (Equation 6). A detection of atomic hydrogen (H) would be a good indication of having the dissociative electron attachment. However, because of a rapid recombination, it is not possible to directly detect atomic hydrogen using a mass spectrometer.

In present invention, an alternative approach to detect the formation of atomic hydrogen and the proceeding of the dissociative electron attachment has been discovered. The present invention is valuable not only for performing EA in a controlled manner, but also for enhancing the EA process by selecting process variables to enhance or maximize the formation of negatively charged ionic hydrogen.

With reference to the experimental setup shown in FIG. 1B, the electron attachment assembly was mounted inside of a quartz tube furnace 104. On the exit port 112 to the furnace 104 a sampling port to a mass spectrometer was added (not illustrated) for characterizing the composition of the effluent gas. A ceramic liner 114 was inserted onto the inside of the tube furnace 104 to prevent arcing damage.

Figure 2:
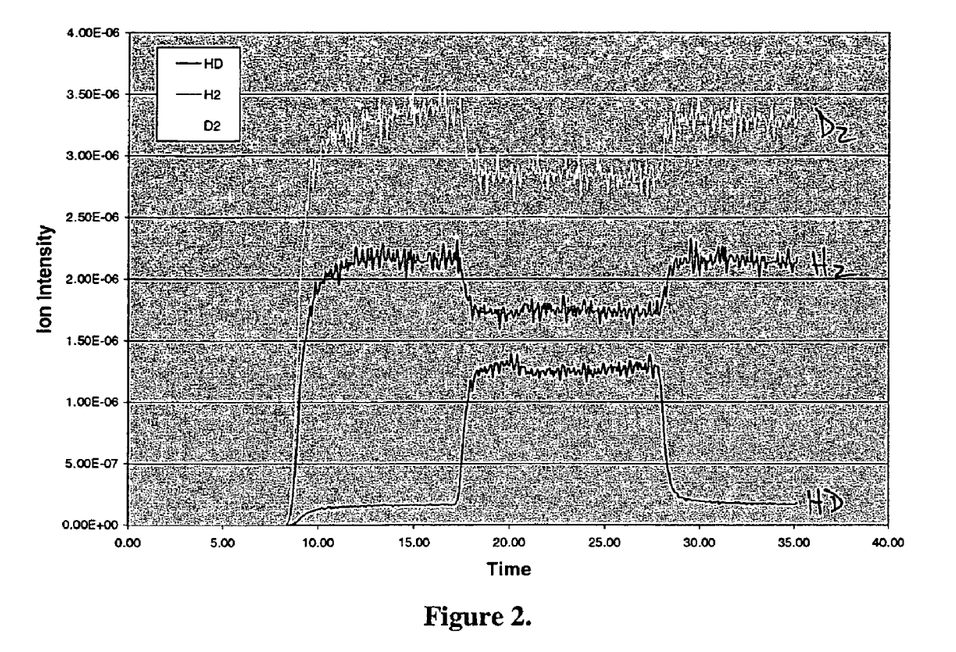
FIG. 2 is a graph of mass spectrometric results of molecular hydrogen-deuterium (HD) formation in the presence of electron generation in dissociative electron attachment at 280° C.

FIG. 2 shows experimental results for flowing $H_2/D_2$ blends. Analysis of the effluent started when the furnace temperature was reached and equilibrated at 280° C. under a $N_2$ flow. Five minutes after data acquisition started, the gas flow was switched from $N_2$ to the process gas mixture of $H_2/D_2$ at volume ratio of 1:1. An electron emission current of 0.25 mA/tip was then applied during the time period of 15 to 25 minutes after data acquisition started. As shown in FIG. 2, the HD intensity increases when the electron emission is applied, and falls back to its original level after electron emission is stopped.

Figure 3:
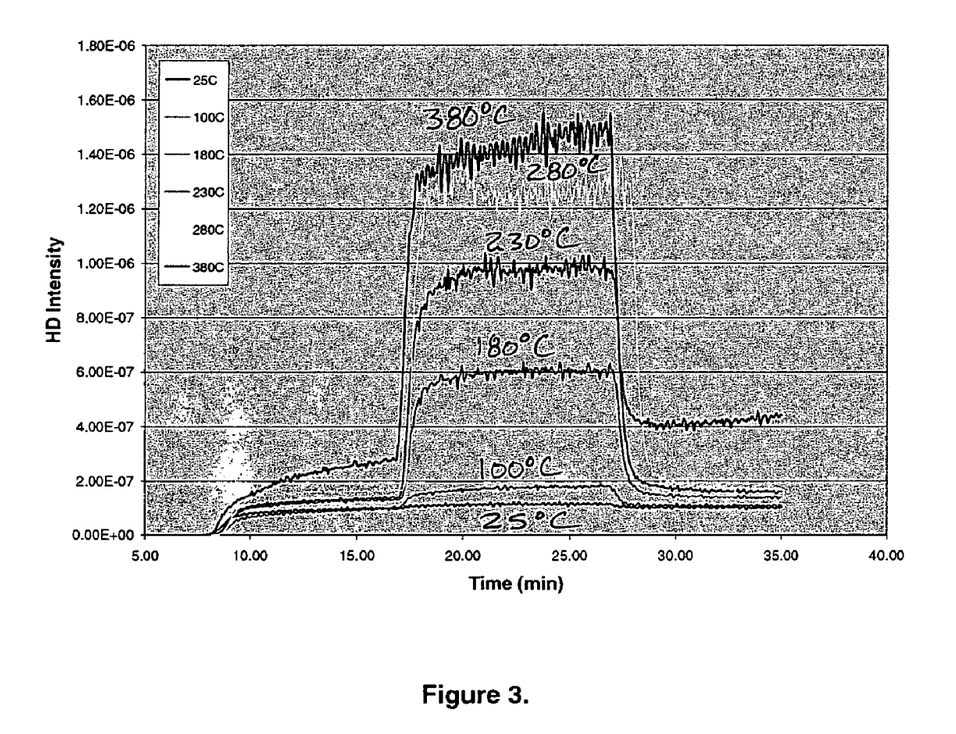
FIG. 3 is a graph of mass spectrometric results of the positive correlation of higher temperatures on higher HD formation.
Figure 4:
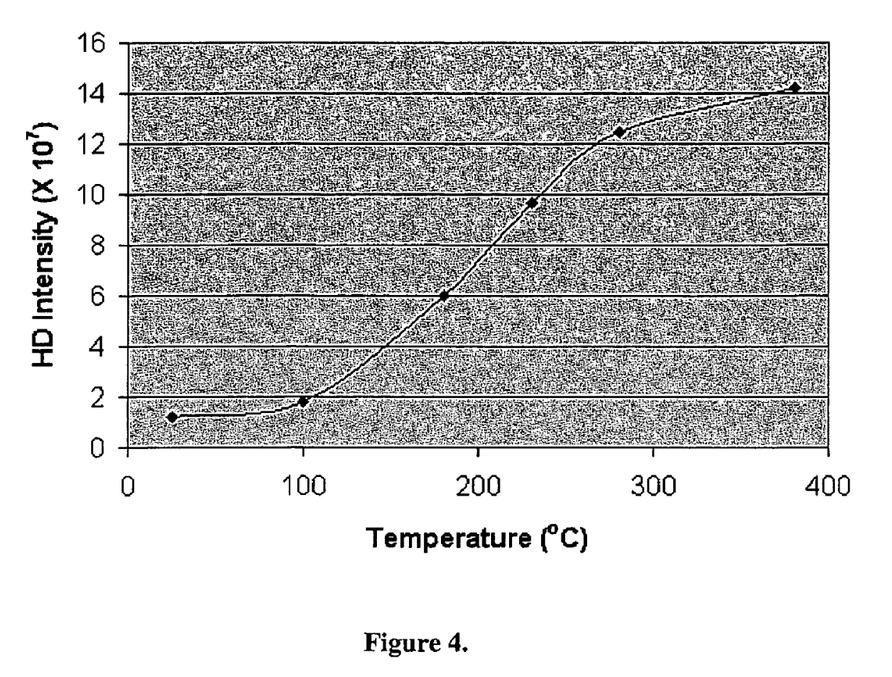
FIG. 4 is another graph of HD peak intensity versus temperature depicting the data of FIG. 3 in another manner.

The above isothermal analysis was repeated at different temperatures. We found that as process temperature is increased the peak HD intensity increases (FIG. 3), which is reasonable since the dissociative attachment is believed to be an endothermic reaction. A summary of the isothermal study is shown in FIG. 4. The data indicates the initiation temperature for the dissociative electron attachment to take place is around 100° C.

Figure 5:
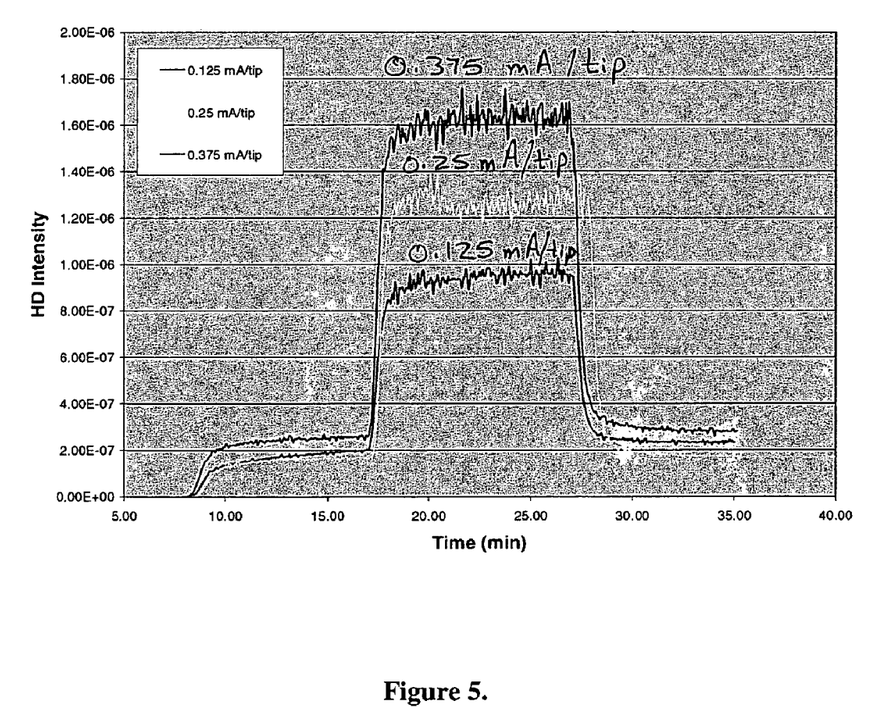
FIG. 5 is a graph of mass spectrometric results of the positive correlation between emission current increase on increased HD formation.
Figure 6:
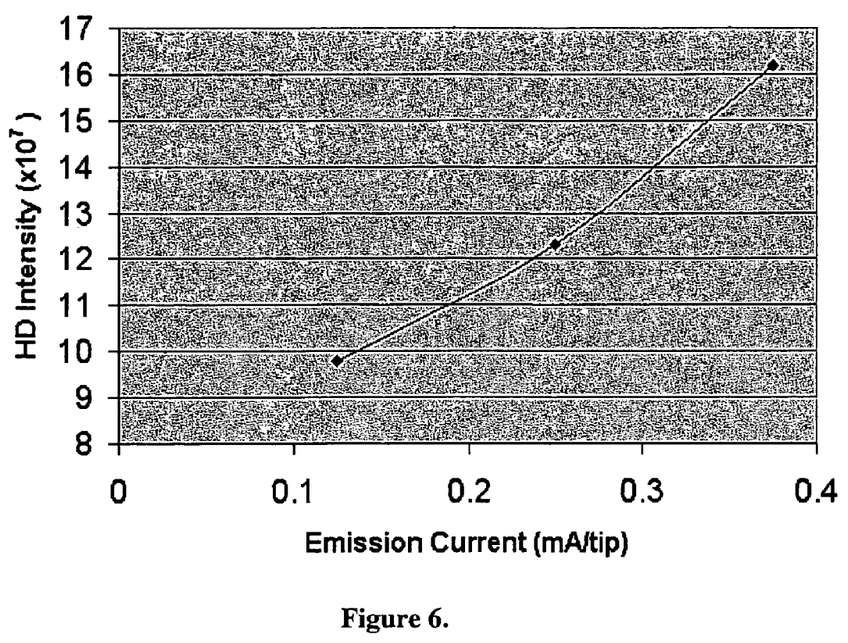
FIG. 6 is another graph of HD peak intensity versus emission current depicting the data of FIG. 5 in another manner.

FIGS. 5 and 6 illustrate the effect of emission current on HD formation at an isothermal temperature of 280° C. The experimental conditions and procedure used for this study were kept the same as discussed above, except we varied the emission current from 0.125 to 0.375 mA/tip. An acceptable range could be from 0.01 mA/tip to 1.0 mA/tip. The HD intensity peak is significantly increased as the emission current is raised. This result confirms that within the process space we have investigated dissociative attachment depends upon the number of electrons emitted from the cathode.

Figure 7:
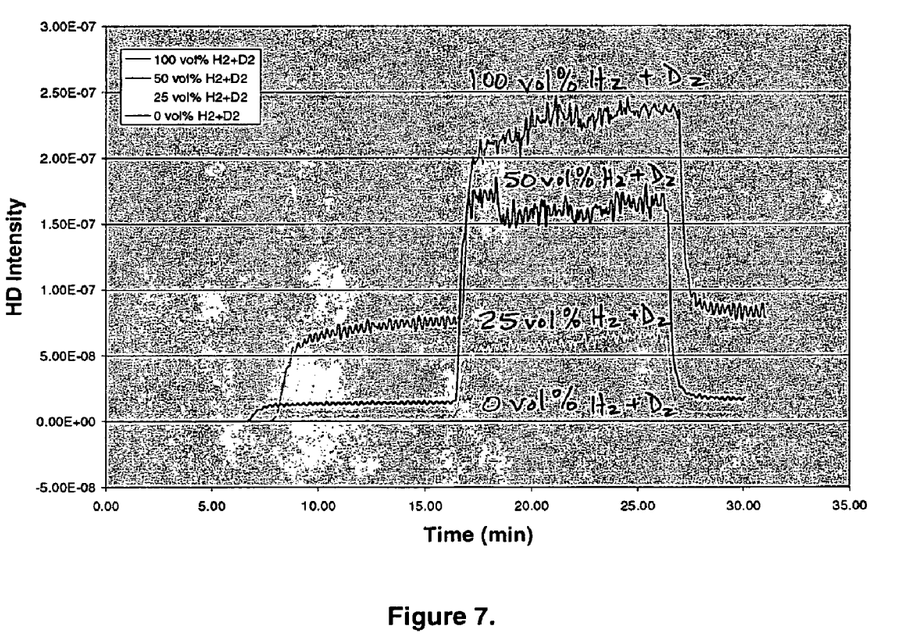
FIG. 7 is a graph of mass spectrometric results of the positive correlation of $H_2+D_2$ Concentration on HD formation.
Figure 8:
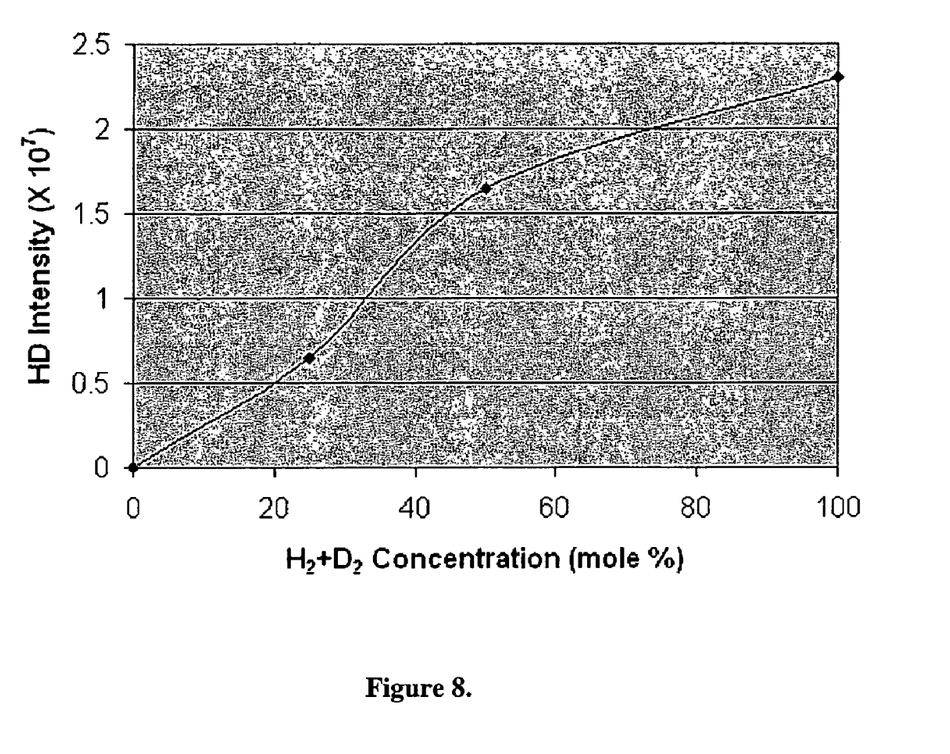
FIG. 8 is another graph of HD Peak Intensity versus $H_2+D_2$ concentration depicting the data of FIG. 7 in another manner.

FIGS. 7 and 8 illustrate the effect of $N_2$ dilution on HD formation at an isothermal temperature of 280° C. We varied the $N_2$ concentration within the feed gas from 0 to 100 vol %, while other experimental variables, such as $H_2/D_2$ ratio and electron emission current, and the test procedure, were held to be the same conditions used for our isothermal studies. The result demonstrates that with increasing $H_2+D_2$ concentration the HD formation continually increases.

Figure 9:
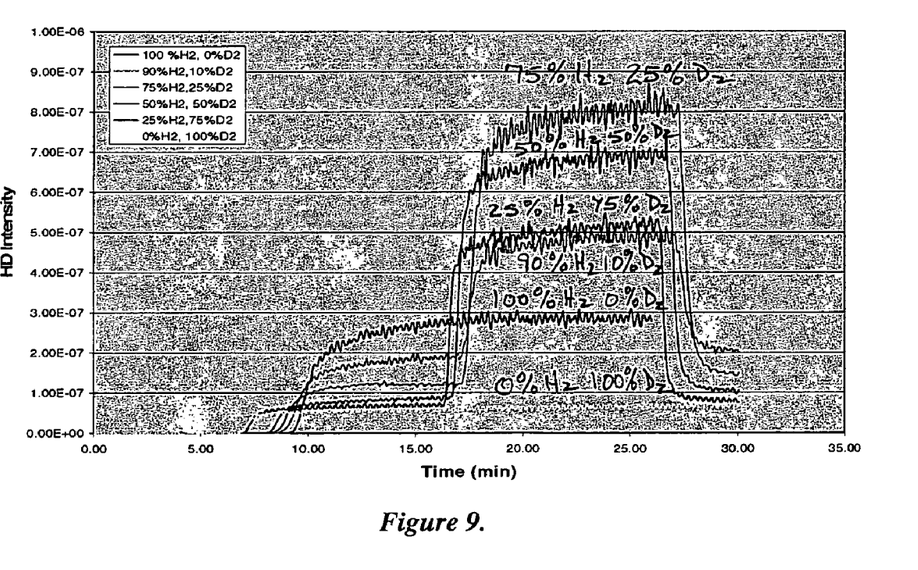
FIG. 9 is a graph of mass spectrometric results of $H_2/D_2$ ratio on HD formation showing 75 vol % $H_2$/25 vol % $D_2$ ratio as the optimal for forming HD.
Figure 10:
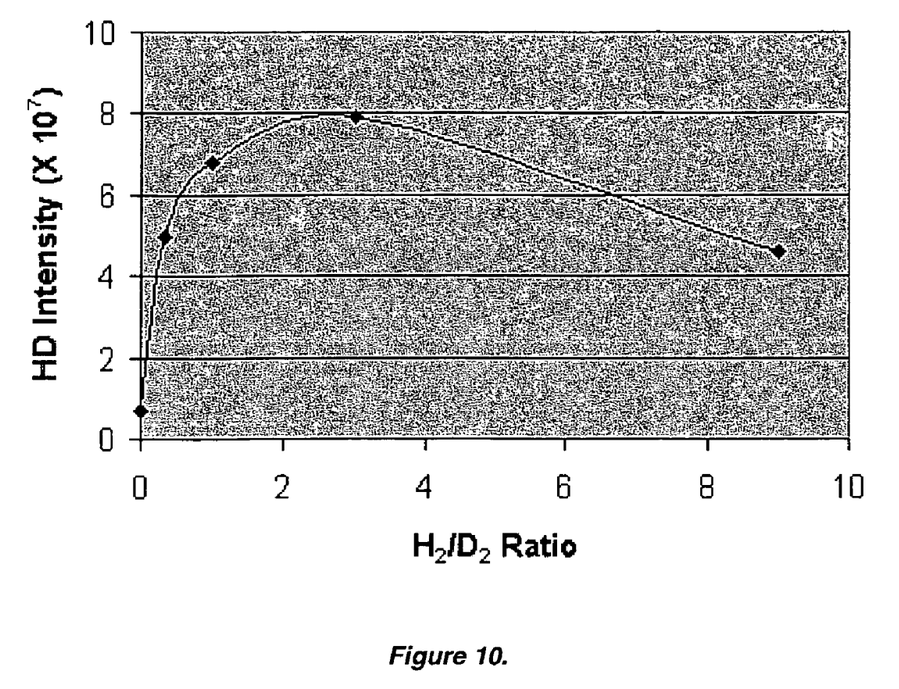
FIG. 10 is another graph of mass spectrometric results of HD Peak Value versus $H_2/D_2$ ratio depicting the data of FIG. 9 in another manner.
Figure 11:
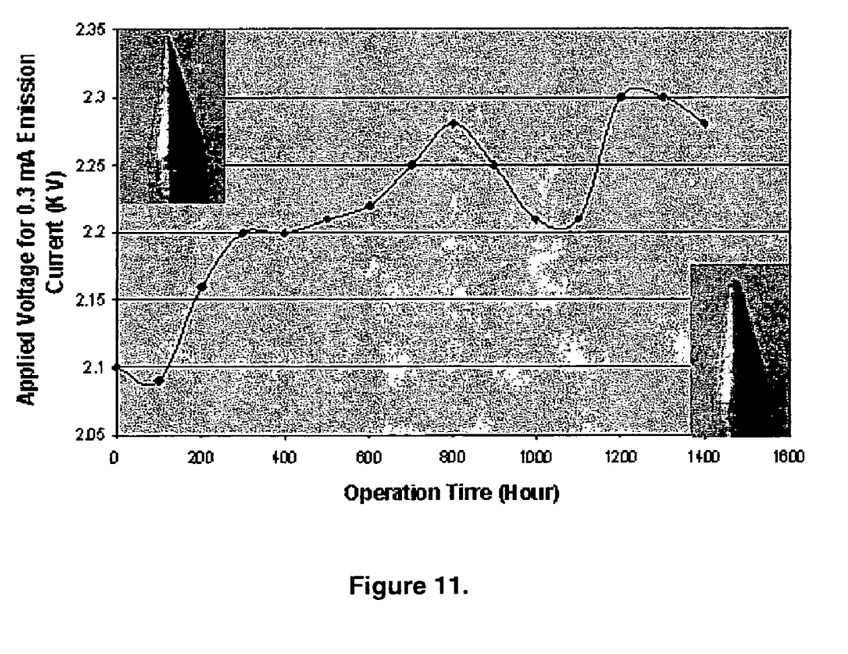
FIG. 11 is a graph of the amount of applied voltage required to sustain a constant emission voltage for the device of the present invention with an illustration of the electrode profile at the initiation of the process and the end of the process cycle.

FIG. 9 is a demonstration of the effect of $H_2/D_2$ ratio on the concentration of the formed HD at 280° C. isothermal temperature. The experimental conditions and procedure used for this study were kept the same as discussed in FIG. 2, except we varied the $H_2/D_2$ ratio from 0 to ∞. The result shows that there is an optimum $H_2/D_2$ ratio on HD formation. FIG. 10 further demonstrates that the optimum ratio of $H_2/D_2$ corresponding with the highest HD concentration under electron attachment is around 2.5 rather than 1.0.

The expected values of the electron attachment assisted $H_2$ fluxless reflow were envisioned as follows.

The initiation temperature for hydrogen to reduce solder oxides can be lowered because the thermal energy required for bond dissociation of molecular hydrogen is reduced.

The negatively charged atomic hydrogen ions formed by electron attachment are driven toward the solder surface by the applied electric field. The preferential adsorption of the active species reduces the effective $H_2$ concentration needed for oxide removal; it enables the use of non-flammable $H_2/N_2$ concentration (e.g. ≦4 vol % $H_2$ in $N_2$).

The probability of attaching electrons on hydrogen molecules would increases with increasing gas pressure due to a reduced energy level of the emitted electrons and an increased hydrogen molecular density in the gas phase. Therefore, it would make the application of the electron attachment process more favorable at ambient pressure than at vacuum.

For applying electron attachment in a gas mixture of 4 vol % $H_2$ in $N_2$, only $H_2$ molecules have a probability for attaching electrons emitted from the cathode. Thus, the efficiency for forming active species should be relatively high.

The formed hydrogen ions by electron attachment repel each other since they are all negatively charged, making their lifetimes relatively long under ambient pressure.

To establish the present EA process described in FIGS. 1A and B, the major challenge was to have a cathode, which could generate electrons uniformly above the wafer surface and have a long lifetime of operation under ambient pressure of a gas environment containing $H_2$, $N_2$, and ppm levels of $O_2$ and $H_2O$. The present inventors developed a novel cathode emission system especially for this application. After exploring many cathode geometries and emission mechanisms (e.g. thermal emission, field emission, and thermal-field emission), a field emission cathode 106 composed of a metal plate with distributed emission tips 107 was designed. To maximize the electric field, each emission tip 107 made from Ni/Cr wire with 0.025 inch in diameter was machined with a sharp end of 10 degree angle that protruded 1.5 cm out of the metal plate surface. The tip spacing was optimized to be 1 cm based on a tradeoff between minimized interference of electric fields among adjacent tips and maximized surface coverage of electron emission.

With the above described cathode emission tip geometry, when a single-polarity pulsed DC voltage with a frequency of 10 KHz and amplitude of 2 KV is applied between the cathode and a grounded wafer, uniform tip illumination is obtained. The emission current can be varied from 0.1 to 0.5 mA/tip for the given pulsed DC voltage. The gas phase was a mixture of 4 vol % $H_2$ in $N_2$, and the gap between the emission tips of the cathode and the surface of the wafer was set to be 1 cm. The voltage pulse was used to minimize arcing, since the time required for effecting cathode emission near the emission tips was known to be shorter than that necessary for effecting complete dielectric breakdown of the gas phase.

The lifetime of the emission tip was tested by monitoring the applied voltage on a single tip for maintaining a constant emission of 0.3 mA. A wearing off of the tip would lead to an increase in the applied voltage. As shown in FIG. 12, the applied voltage slightly increases with increasing operation time, and there is a noticeable shape change of the emission tip to a less sharpened tip after the lifetime test. The local variation on the voltage curve is believed to be related to the changes of $H_2O$ and $O_2$ contamination levels in the $N_2$ supply. Even at the end of this test, the electron emission performance of the tip was still quite normal.

The invention claimed is:

1. A method of dry fluxing metal surfaces of one or more components to be soldered by electron attachment using a gas mixture of reducing gas comprising hydrogen and deuterium, comprising the steps of:
   a) providing one or more components to be soldered which are connected to a first electrode as a target assembly;
   b) providing a second electrode adjacent said target assembly;
   c) providing a gas mixture comprising a reducing gas comprising hydrogen and deuterium between said first and second electrodes;
   d) providing a direct current (DC) voltage to said first and second electrodes to form an emission current between the electrodes and donating electrons to said reducing gas to form negatively charged ionic reducing gas and molecules of hydrogen bonded to deuterium;

e) contacting said target assembly with said negatively charged ionic reducing gas and reducing oxides on said target assembly.

2. The method of claim 1 wherein said reducing gas comprises hydrogen, deuterium and an inert gas.

3. The method of claim 1 wherein a concentration of molecules of hydrogen bonded to deuterium is determined.

4. The method of claim 3 wherein said concentration is used to adjust method conditions selected from the group consisting of a volume of the gas mixture being provided, the voltage of the direct current, a temperature at which the gas mixture is maintained and combinations thereof, to increase formation of the negatively charged ionic reducing gas.

5. The method of claim 4 wherein providing a gas mixture comprising a reducing gas comprising hydrogen and deuterium between said first and second electrodes is discontinued and subsequently a gas mixture of hydrogen and an inert gas is provided between said first and second electrodes and molecules of hydrogen bonded to deuterium are not formed.

6. The method of claim 1 wherein at least one electrode has emission tips and an emission current between 0.01 mA/tip and 1.0 mA/tip.

7. The method of claim 6 wherein at least one electrode has emission tips and an emission current between 0.125 mA/tip and 0.375 mA/tip.

8. The method of claim 2 wherein the concentration of hydrogen to deuterium molecules in the inert gas is between 25 vol % hydrogen:75 vol % deuterium to 90 vol % hydrogen: 10 vol % deuterium.

9. The method of claim 2 wherein the concentration of hydrogen to deuterium molecules in the inert gas is 75 vol % hydrogen:25 vol % deuterium.

10. The method of claim 2 wherein the ratio of hydrogen to deuterium molecules in the inert gas is 2.5:1.

11. The method of claim 1 wherein said gas mixture is at a temperature in a range of 100 to 400° C.

12. The method of claim 11 wherein said target assembly is at a temperature in a range of 220° C. to 320° C.

13. The method of claim 1 wherein said voltage is in a range of approximately −1 to −50 kV.

14. The method of claim 1 wherein a distance between said target assembly and said second electrode is approximately 0.5 to 10 cm.

15. The method of claim 14 wherein a distance between said target assembly and said second electrode is approximately 1 to 5 cm.

16. A method of dry fluxing solder of one or more components to be soldered, comprising the steps of:

a) providing one or more components to be soldered and solder which are positioned on an anode as a target assembly;

b) providing a cathode adjacent said target assembly;

c) providing a reducing gas mixture comprising hydrogen, deuterium and an inert gas between said anode and cathode at elevated temperature;

d) providing a direct current (DC) voltage to said anode and cathode to donate electrons to said reducing gas mixture to form negatively charged ionic hydrogen and molecules of hydrogen bonded to deuterium;

e) contacting said target assembly with said negatively charged ionic hydrogen and reducing oxides on said components and said solder.

17. The method of claim 16 wherein a concentration of molecules of hydrogen bonded to deuterium is determined.

18. The method of claim 17 wherein said concentration is used to adjust method conditions selected from the group consisting of a volume of the gas mixture being provided, the voltage of the direct current, a temperature at which the gas mixture is maintained and combinations thereof, to increase formation of the negatively charged ionic reducing gas.

19. The method of claim 18 wherein providing a gas mixture comprising a reducing gas comprising hydrogen and deuterium between said first and second electrodes is discontinued and subsequently a gas mixture of hydrogen and an inert gas is provided between said first and second electrodes and molecules of hydrogen bonded to deuterium are not formed.

20. A method of treating a surface with atoms subjected to electron attachment using a mixture of the atoms and deuterium, comprising the steps of:

a) providing one or more surfaces to be treated which are connected to a first electrode as a target assembly;

b) providing a second electrode adjacent said target assembly;

c) providing a mixture comprising atoms to be subjected to electron attachment and deuterium between said first and second electrodes;

d) providing a direct current (DC) voltage to said first and second electrodes to form an emission current between the electrodes and donating electrons to said mixture to form negatively charged ionic atoms and molecules of the atom bonded to deuterium;

e) contacting said target assembly with said negatively charged ionic atom and treating said surface with said negatively charged ionic atom on said target assembly.

21. The method of claim 20 wherein a concentration of molecules of atoms to be subjected to electron attachment bonded to deuterium is determined.

22. The method of claim 21 wherein said concentration is used to adjust method conditions selected from the group consisting of a volume of the gas mixture being provided, the voltage of the direct current, a temperature at which the gas mixture is maintained and combinations thereof, to increase formation of the negatively charged ionic atoms.

23. The method of claim 22 wherein providing a mixture comprising atoms to be subjected to electron attachment and deuterium between said first and second electrodes is discontinued and subsequently a mixture of atoms to be subjected to electron attachment and an inert gas is provided between said first and second electrodes and molecules of atoms to be subjected to electron attachment bonded to deuterium are not formed.

* * * * *